US011822200B2

(12) United States Patent
Li et al.

(10) Patent No.: US 11,822,200 B2
(45) Date of Patent: Nov. 21, 2023

(54) THIN FILM TRANSISTOR ARRAY SUBSTRATE AND TOUCH DISPLAY PANEL

(71) Applicant: Wuhan China Star Optoelectronics Technology Co., Ltd., Hubei (CN)

(72) Inventors: Yanyang Li, Hubei (CN); Mang Zhao, Hubei (CN); Yong Tian, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 681 days.

(21) Appl. No.: 16/966,106

(22) PCT Filed: Jun. 19, 2020

(86) PCT No.: PCT/CN2020/096964
§ 371 (c)(1),
(2) Date: Jul. 30, 2020

(87) PCT Pub. No.: WO2021/217827
PCT Pub. Date: Nov. 4, 2021

(65) Prior Publication Data
US 2023/0176435 A1  Jun. 8, 2023

(30) Foreign Application Priority Data
Apr. 30, 2020 (CN) .......................... 202010362516.6

(51) Int. Cl.
| G02F 1/1368 | (2006.01) |
| G06F 3/041 | (2006.01) |
| G02F 1/1333 | (2006.01) |
| G02F 1/1335 | (2006.01) |
| G02F 1/1362 | (2006.01) |
| H01L 27/12 | (2006.01) |

(52) U.S. Cl.
CPC ........ *G02F 1/1368* (2013.01); *G02F 1/13338* (2013.01); *G02F 1/133514* (2013.01); *G02F 1/136286* (2013.01); *G06F 3/0412* (2013.01); *G06F 3/04164* (2019.05); *H01L 27/124* (2013.01)

(58) Field of Classification Search
CPC .. G02F 1/1368; G02F 1/13338; G06F 3/0412; G06F 3/04164; H01L 27/124
USPC .......................................................... 349/12
See application file for complete search history.

(56) References Cited

U.S. PATENT DOCUMENTS

| 2019/0250762 A1* | 8/2019 | Aoyama ............... G06F 3/0412 |
| 2020/0273884 A1* | 8/2020 | Tsai .................. G02F 1/136286 |

FOREIGN PATENT DOCUMENTS

| CN | 104345969 | 2/2015 |
| CN | 104536673 | 4/2015 |

(Continued)

*Primary Examiner* — Charles S Chang

(57) ABSTRACT

A thin film transistor array substrate and a touch display panel are provided, including a plurality of touch electrodes. The touch electrodes include a first touch electrode, a second touch electrode, and a third touch electrode arranged along a first direction. A number of the touch traces electrically connected between the second touch electrode and the first common power line is greater than or equal to a number of the touch traces electrically connected between the first touch electrode and the first common power line, and is less than a number of the touch traces electrically connected between the third touch electrode and the first common power line.

18 Claims, 8 Drawing Sheets

(56) References Cited

FOREIGN PATENT DOCUMENTS

| | | |
|---|---|---|
| CN | 104699321 | 6/2015 |
| CN | 105573556 | 5/2016 |
| CN | 107992229 | 5/2018 |
| CN | 109324455 | 2/2019 |
| CN | 109947304 | 6/2019 |
| KR | 10-2015-0063760 | 6/2015 |
| KR | 10-2019-0029045 | 3/2019 |

* cited by examiner

THIN FILM TRANSISTOR ARRAY SUBSTRATE AND TOUCH DISPLAY PANEL

RELATED APPLICATIONS

This application is a National Phase of PCT Patent Application No. PCT/CN2020/096964 having International filing date of Jun. 19, 2020, which claims the benefit of priority of Chinese Patent Application No. 202010362516.6 filed on Apr. 30, 2020. The contents of the above applications are all incorporated by reference as if fully set forth herein in their entirety.

FIELD AND BACKGROUND OF THE INVENTION

The present disclosure relates to the technical field of display, and particularly to a thin film transistor array substrate and a touch display panel.

With the development of touch display technology, in-cell touch display panels are increasingly used in electronic display devices such as mobile phones. Because touch and display functions are integrated into in-cell touch display panels, that is, both a touch circuit and a display circuit are integrated into a thin film transistor array substrate (TFT array substrate), it is advantageous for improving transmittance and making electronic display devices such as mobile phones lighter and thinner.

The touch function of an in-cell touch display panel is accomplished by touch electrodes integrated into a thin film transistor array substrate, touch traces electrically connected to the touch electrodes, and a driving chip. The touch electrodes are electrically connected to a common electrode in the thin film transistor array substrate. Therefore, a voltage change in the touch electrodes will directly affect a voltage of the common electrode, which in turn affects display function of the display panel. A common power line and the driving chip are electrically connected to the touch electrodes through the touch traces, so as to respectively realize voltage transmission and signal collection to the touch electrodes. However, considering that there are a limited number of channels of the driving chip configured to connect the touch traces and influence of a number of the touch traces on a resolution of the panel, it is generally impossible in actual production to ensure that each of the touch electrodes is connected to a same number of the touch traces. Numbers of the touch traces connected to the touch electrodes directly affect voltages of the touch electrodes, which in turn affects uniformity of a voltage distribution of the common electrode, causing the display panel to be divided into upper and lower screens and display unevenly.

In the thin film transistor array substrate, the numbers of the touch traces connected to the touch electrodes directly affect the voltages of the touch electrodes and the voltage of the common electrode connected to the touch electrodes. A large difference between the numbers of touch traces connected to different touch electrodes will adversely affect the uniformity of the voltage distribution of the common electrode, which may easily cause the display panel to be divided into upper and lower screens and display unevenly.

SUMMARY OF THE INVENTION

In order to solve the above technical problem, the present disclosure provides the following technical solutions.

The present disclosure provides a thin film transistor array substrate comprising a base substrate having a non-display area, a thin film transistor array layer disposed on the base substrate, and a touch function layer disposed in the thin film transistor array layer. The touch function layer comprises a plurality of touch electrodes. Each of the touch electrodes is electrically connected to a first common power line and a driving chip through one or more touch traces. The touch electrodes comprise a first touch electrode, a second touch electrode, and a third touch electrode sequentially arranged adjacent to each other along a first direction. A number of the touch traces electrically connected between the second touch electrode and the first common power line is greater than or equal to a number of the touch traces electrically connected between the first touch electrode and the first common power line, and the number of the touch traces electrically connected between the second touch electrode and the first common power line is less than a number of the touch traces electrically connected between the third touch electrode and the first common power line. Alternately, the number of the touch traces electrically connected between the second touch electrode and the first common power line is less than the number of the touch traces electrically connected between the first touch electrode and the first common power line, and the number of the touch traces electrically connected between the second touch electrode and the first common power line is greater than or equal to the number of the touch traces electrically connected between the third touch electrode and the first common power line.

In the thin film transistor array substrate, a number of the touch traces electrically connected between the second touch electrode and the driving chip is greater than a number of the touch traces electrically connected between the first touch electrode and the driving chip, and the number of the touch traces electrically connected between the second touch electrode and the driving chip is less than or equal to a number of the touch traces electrically connected between the third touch electrode and the driving chip. Alternatively, the number of the touch traces electrically connected between the second touch electrode and the driving chip is less than or equal to the number of the touch traces electrically connected between the first touch electrode and the driving chip, and the number of the touch traces electrically connected between the second touch electrode and the driving chip is greater than the number of the touch traces electrically connected between the third touch electrode and the driving chip.

In the thin film transistor array substrate, the number of the touch traces electrically connected between the second touch electrode and the first common power line is greater than or equal to the number of the touch traces electrically connected between the first touch electrode and the first common power line, and the number of the touch traces electrically connected between the second touch electrode and the first common power line is less than the number of the touch traces electrically connected between the third touch electrode and the first common power line. Further, the number of the touch traces electrically connected between the second touch electrode and the driving chip is less than or equal to the number of the touch traces electrically connected between the third touch electrode and the driving chip, and the number of the touch traces electrically connected between the second touch electrode and the driving chip is greater than the number of the touch traces electrically connected between the first touch electrode and the driving chip.

In the thin film transistor array substrate, the first touch electrode and the second touch electrode are arranged adjacent to each other along the first direction. The number of the touch traces electrically connected between the second touch electrode and the first common power line is equal to the number of the touch traces electrically connected between the first touch electrode and the first common power line. The number of the touch traces electrically connected between the second touch electrode and the driving chip is greater than the number of the touch traces electrically connected between the first touch electrode and the driving chip.

In the thin film transistor array substrate, the second touch electrode and the third touch electrode are arranged adjacent to each other along the first direction. The number of the touch traces electrically connected between the second touch electrode and the first common power line is less than the number of the touch traces electrically connected between the third touch electrode and the first common power line. The number of the touch traces electrically connected between the second touch electrode and the driving chip is equal to the number of the touch traces electrically connected between the third touch electrode and the driving chip.

In the thin film transistor array substrate, the first touch electrode, the second touch electrode, and the third touch electrode are sequentially arranged adjacent to each other along the first direction. The number of the touch traces electrically connected between the second touch electrode and the first common power line is equal to the number of the touch traces electrically connected between the first touch electrode and the first common power line, and the number of the touch traces electrically connected between the second touch electrode and the driving chip is greater than the number of the touch traces electrically connected between the first touch electrode and the driving chip. Further, the number of the touch traces electrically connected between the second touch electrode and the first common power line is less than the number of the touch traces electrically connected between the third touch electrode and the first common power line, and the number of the touch traces electrically connected between the second touch electrode and the driving chip is equal to the number of the touch traces electrically connected between the third touch electrode and the driving chip.

In the thin film transistor array substrate, the number of the touch traces electrically connected between the second touch electrode and the first common power line is greater than or equal to the number of the touch traces electrically connected between the third touch electrode and the first common power line, and the number of the touch traces electrically connected between the second touch electrode and the first common power line is less than the number of the touch traces electrically connected between the first touch electrode and the first common power line. Further, the number of the touch traces electrically connected between the second touch electrode and the driving chip is less than or equal to the number of the touch traces electrically connected between the first touch electrode and the driving chip, and the number of the touch traces electrically connected between the second touch electrode and the driving chip is greater than the number of the touch traces electrically connected between the third touch electrode and the driving chip.

In the thin film transistor array substrate, the first touch electrode and the second touch electrode are arranged adjacent to each other along the first direction. The number of the touch traces electrically connected between the second touch electrode and the first common power line is less than the number of the touch traces electrically connected between the first touch electrode and the first common power line. The number of the touch traces electrically connected between the second touch electrode and the driving chip is equal to the number of the touch traces electrically connected between the first touch electrode and the driving chip.

In the thin film transistor array substrate, the second touch electrode and the third touch electrode are arranged adjacent to each other along the first direction. The number of the touch traces electrically connected between the second touch electrode and the first common power line is equal to the number of the touch traces electrically connected between the third touch electrode and the first common power line. The number of the touch traces electrically connected between the second touch electrode and the driving chip is greater than the number of the touch traces electrically connected between the third touch electrode and the driving chip.

In the thin film transistor array substrate, the first touch electrode, the second touch electrode, and the third touch electrode are sequentially arranged adjacent to each other along the first direction. The number of the touch traces electrically connected between the second touch electrode and the first common power line is less than the number of the touch traces electrically connected between the first touch electrode and the first common power line, and the number of the touch traces electrically connected between the second touch electrode and the driving chip is equal to the number of the touch traces electrically connected between the first touch electrode and the driving chip. Further, the number of the touch traces electrically connected between the second touch electrode and the first common power line is equal to the number of the touch traces electrically connected between the third touch electrode and the first common power line, and the number of the touch traces electrically connected between the second touch electrode and the driving chip is greater than the number of the touch traces electrically connected between the third touch electrode and the driving chip.

In the thin film transistor array substrate, the thin film transistor array layer comprises an active layer disposed on the base substrate, a gate insulating layer disposed on the active layer, a gate electrode disposed on the gate insulating layer, an interlayer insulating layer disposed on the gate electrode, and a source/drain electrode disposed on the interlayer insulating layer. The thin film transistor array substrate further comprises a first insulating layer disposed on the source/drain electrode, a common electrode disposed on the first insulating layer, a second insulating layer disposed on the common electrode, and a pixel electrode is disposed on the second insulating layer. The common electrode is electrically connected to the touch electrodes through via holes in the first insulating layer. The pixel electrode is electrically connected to the source/drain electrode through a via hole penetrating the first insulating layer and the second insulating layer.

In the thin film transistor array substrate, the first common power line and the driving chip are disposed in the non-display area, and are respectively disposed at opposite sides of the touch function layer along the first direction.

In the thin film transistor array substrate, a second common power line is disposed on the same side as the driving chip, and is electrically connected to the touch electrodes by the touch traces.

In the thin film transistor array substrate, a first switching transistor is disposed on the touch traces connected between the touch electrodes and the first common power line, and a second switching transistor is disposed on the touch traces connected between the touch electrodes and the second common power line.

The present disclosure further provides a touch display panel comprising a thin film transistor array substrate. The thin film transistor array substrate comprises a base substrate having a non-display area, a thin film transistor array layer disposed on the base substrate, and a touch function layer disposed in the thin film transistor array layer and comprising a plurality of touch electrodes. Each of the touch electrodes is electrically connected to a first common power line and a driving chip through one or more touch traces. The touch electrodes comprise a first touch electrode, a second touch electrode, and a third touch electrode sequentially arranged adjacent to each other along a first direction. A number of the touch traces electrically connected between the second touch electrode and the first common power line is greater than or equal to a number of the touch traces electrically connected between the first touch electrode and the first common power line, and the number of the touch traces electrically connected between the second touch electrode and the first common power line is less than a number of the touch traces electrically connected between the third touch electrode and the first common power line. Alternately, the number of the touch traces electrically connected between the second touch electrode and the first common power line is less than the number of the touch traces electrically connected between the first touch electrode and the first common power line, and the number of the touch traces electrically connected between the second touch electrode and the first common power line is greater than or equal to the number of the touch traces electrically connected between the third touch electrode and the first common power line.

In an embodiment, the touch display panel further comprises a color filter substrate disposed opposite to the thin film transistor array substrate, and liquid crystals disposed between the thin film transistor array substrate and the color filter substrate.

In the touch display panel, a number of the touch traces electrically connected between the second touch electrode and the driving chip is greater than a number of the touch traces electrically connected between the first touch electrode and the driving chip, and the number of the touch traces electrically connected between the second touch electrode and the driving chip is less than or equal to a number of the touch traces electrically connected between the third touch electrode and the driving chip. Alternatively, the number of the touch traces electrically connected between the second touch electrode and the driving chip is less than or equal to the number of the touch traces electrically connected between the first touch electrode and the driving chip, and the number of the touch traces electrically connected between the second touch electrode and the driving chip is greater than the number of the touch traces electrically connected between the third touch electrode and the driving chip.

In the touch display panel, the number of the touch traces electrically connected between the second touch electrode and the first common power line is greater than or equal to the number of the touch traces electrically connected between the first touch electrode and the first common power line, and the number of the touch traces electrically connected between the second touch electrode and the first common power line is less than the number of the touch traces electrically connected between the third touch electrode and the first common power line. Further, the number of the touch traces electrically connected between the second touch electrode and the driving chip is less than or equal to the number of the touch traces electrically connected between the third touch electrode and the driving chip, and the number of the touch traces electrically connected between the second touch electrode and the driving chip is greater than the number of the touch traces electrically connected between the first touch electrode and the driving chip.

In the touch display panel, the number of the touch traces electrically connected between the second touch electrode and the first common power line is greater than or equal to the number of the touch traces electrically connected between the third touch electrode and the first common power line, and the number of the touch traces electrically connected between the second touch electrode and the first common power line is less than the number of the touch traces electrically connected between the first touch electrode and the first common power line. Further, the number of the touch traces electrically connected between the second touch electrode and the driving chip is less than or equal to the number of the touch traces electrically connected between the first touch electrode and the driving chip, and the number of the touch traces electrically connected between the second touch electrode and the driving chip is greater than the number of the touch traces electrically connected between the third touch electrode and the driving chip.

The present disclosure further provides a touch display panel comprising a thin film transistor array substrate, a color filter substrate disposed opposite to the thin film transistor array substrate, and liquid crystals disposed between the thin film transistor array substrate and the color filter substrate. The thin film transistor array substrate comprises a base substrate having a non-display area, a thin film transistor array layer disposed on the base substrate, and a touch function layer disposed in the thin film transistor array layer and comprising a plurality of touch electrodes. Each of the touch electrodes is electrically connected to a first common power line and a driving chip through one or more touch traces. The touch electrodes comprise a first touch electrode, a second touch electrode, and a third touch electrode sequentially arranged adjacent to each other along a first direction. A number of the touch traces electrically connected between the second touch electrode and the first common power line is equal to a number of the touch traces electrically connected between the first touch electrode and the first common power line, a number of the touch traces electrically connected between the second touch electrode and the driving chip is greater than a number of the touch traces electrically connected between the first touch electrode and the driving chip, the number of the touch traces electrically connected between the second touch electrode and the first common power line is less than a number of the touch traces electrically connected between the third touch electrode and the first common power line, and the number of the touch traces electrically connected between the second touch electrode and the driving chip is equal to a number of the touch traces electrically connected between the third touch electrode and the driving chip. Alternatively, the number of the touch traces electrically connected between the second touch electrode and the first common power line is less than the number of the touch traces electrically connected between the first touch electrode and the first common power line, the number of the touch traces electrically connected between the second touch electrode and the driving chip is equal to the number of the touch traces electrically connected between the first touch electrode and the driving chip, the number of the touch traces electrically connected between the second touch electrode and the first common power line is equal to the number of the touch traces electrically connected between the third touch electrode and the first common power line, and the number of the touch traces electrically connected between the second touch electrode and the driving chip is greater than the number of the touch traces electrically connected between the third touch electrode and the driving chip.

In the present disclosure, numbers of touch traces electrically connected between touch electrodes and a first common power line, and between the touch electrodes and a driving chip are rationally configured to eliminate or reduce a sudden change in voltage due to a difference in the numbers of the touch traces connected different touch electrodes to the first common power line and the driving chip. This makes voltage distributions of the touch electrodes and the common electrode in the thin film transistor array substrate become more consistent, thereby improving display quality of a display panel.

BRIEF DESCRIPTION OF THE SEVERAL VIEWS OF THE DRAWINGS

In order to more clearly illustrate technical solutions in embodiments or in the prior art, a brief description of the accompanying drawings used in the description of the embodiments or in the prior art will be given below. Obviously, the accompanying drawings in the following description are merely some embodiments of the present disclosure. For those skilled in the art, other drawings may be obtained from these accompanying drawings without creative labor.

DESCRIPTION OF SPECIFIC EMBODIMENTS OF THE INVENTION

Figure 1:
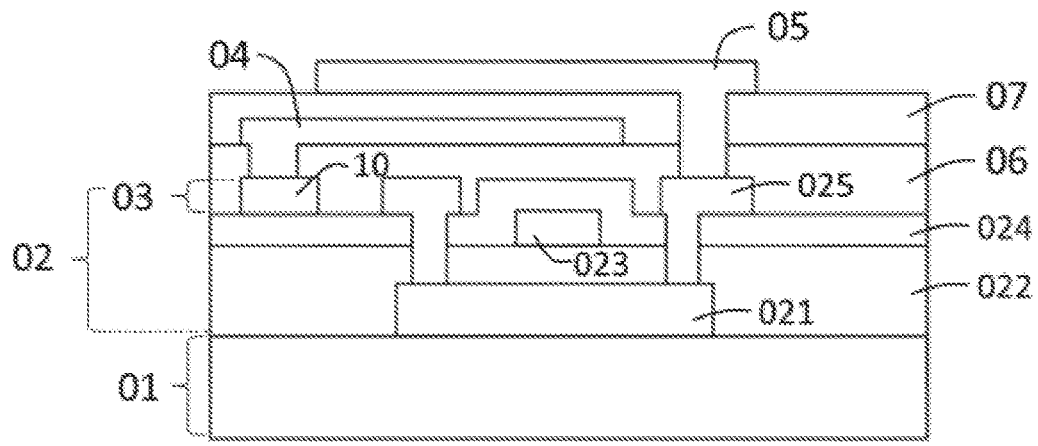
FIG. 1 is a partial cross-sectional schematic diagram of a thin film transistor array substrate according to an embodiment of the present disclosure.

The following description of various embodiments with reference to the accompanying drawings is used to illustrate specific embodiments of the present disclosure that can be practiced. Directional terms mentioned in the present disclosure, such as "above", "below", "front", "rear", "left", "right", "inside", "outside", "side", are merely used to indicate the direction of the accompanying drawings. Therefore, the directional terms are used for illustrating and understanding the present disclosure rather than limiting the present disclosure. In the drawings, elements with similar structures are indicated by same reference numerals.

The present disclosure provides a thin film transistor array substrate comprising a plurality of touch electrodes. Each of the touch electrodes is electrically connected to a first common power line and a driving chip through one or more touch traces. In the present disclosure, numbers of touch traces electrically connected between touch electrodes and a first common power line and between the touch electrodes and a driving chip are rationally configured to eliminate or reduce a sudden change in voltage due to a difference in the numbers of the touch traces connected different touch electrodes to the first common power line and the driving chip. This makes voltage distributions of the touch electrodes and the common electrode in the thin film transistor array substrate tend to be consistent, thereby improving image quality.

Figure 2:
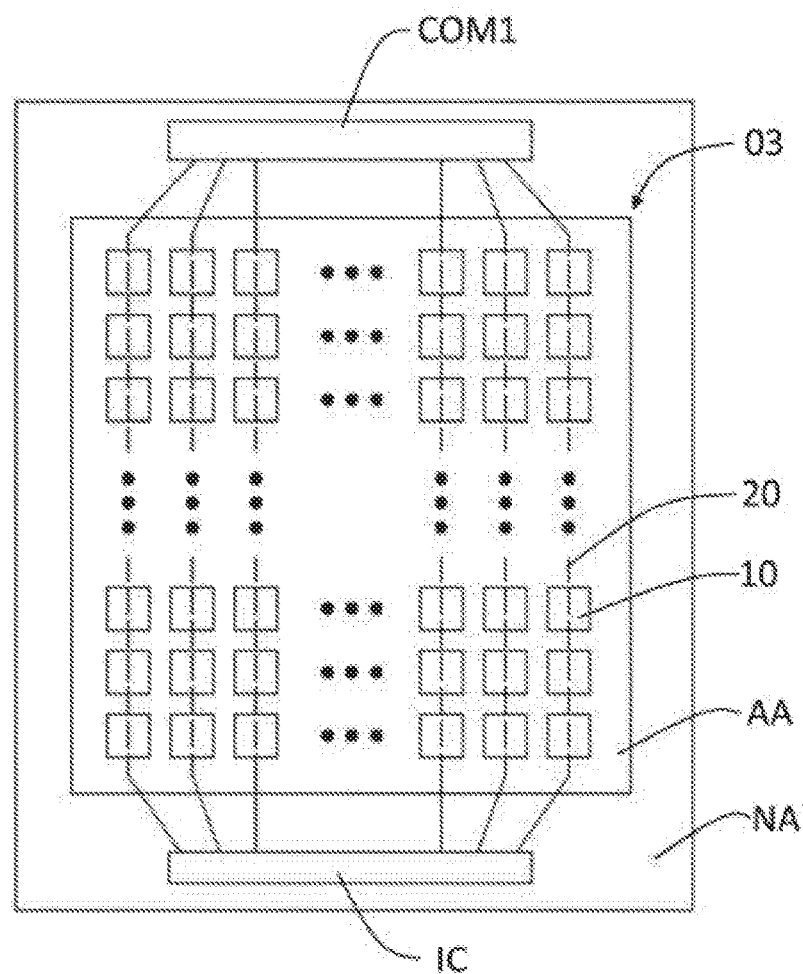
FIG. 2 is a top view of the thin film transistor array substrate according to an embodiment of the present disclosure.

Please refer to FIG. 1 and FIG. 2. FIG. 1 is a partial cross-sectional schematic diagram of a thin film transistor array substrate according to an embodiment of the present disclosure. FIG. 2 is a top view of the thin film transistor array substrate according to an embodiment of the present disclosure. The thin film transistor array substrate comprises a base substrate 01, a thin film transistor array layer 02 disposed on the base substrate 01, and a common electrode 04 and a pixel electrode 05 disposed on the thin film transistor array layer 02. The thin film transistor array substrate further comprises a touch function layer 03 disposed in the thin film transistor array layer 02. The touch function layer 03 is configured to realize a touch function of the thin film transistor array substrate.

Optionally, the thin film transistor array layer 02 comprises an active layer 021 disposed on the base substrate 01, a gate insulating layer 022 disposed on the active layer 021, a gate electrode 023 disposed on the gate insulating layer 022, an interlayer insulating layer 024 disposed on the gate electrode 023, and a source/drain electrode 025 disposed on the interlayer insulating layer 024. A plurality of touch electrodes 10 are disposed on a same layer as the source/drain electrode 025. A first insulating layer 06 is disposed between the thin film transistor array layer 02 and the common electrode 04. A second insulating layer 07 is disposed between the common electrode 04 and the pixel electrode 05. The pixel electrode 05 is electrically connected to the source/drain electrode 025 through a via hole penetrating the first insulating layer 06 and the second insulating layer 07 to realize signal transmission from the thin film transistor array layer 02 to the pixel electrode 05. The common electrode 04 is electrically connected to the touch electrodes 10 through via holes in the first insulating layer 06.

Furthermore, the touch function layer 03 comprises the touch electrodes 10. The base substrate 01 has a display area AA and a non-display area NA. The non-display area NA is provided with a first common power line COM1 and a driving chip IC. Each of the touch electrodes 10 is electrically connected to a first common power line COM1 and a driving chip IC through one or more touch traces 20. The first common power line COM1 is configured to provide a common voltage signal to the touch electrodes 10. The driving chip IC is configured to provide a voltage signal to the touch electrodes 10 and perform signal acquisition and analysis. Optionally, the first common power line COM1 and the driving chip IC are respectively disposed at opposite sides of the touch function layer 03, so as to simultaneously provide voltage signals to the touch electrodes 10 from both ends.

Figure 3:
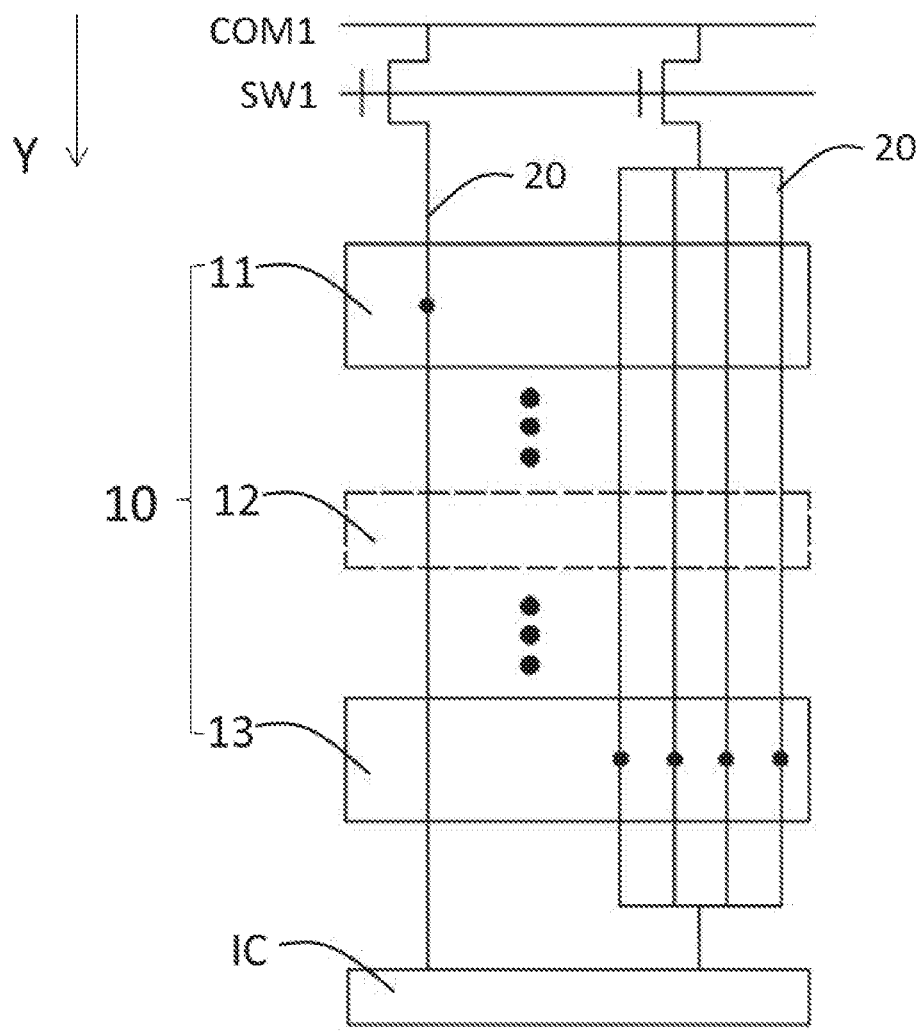
FIG. 3 is a schematic diagram of a first wiring manner of touch traces electrically connected between touch electrodes and a first common power line, and between the touch electrodes and a driving chip according to an embodiment of the present disclosure.
Figure 4:
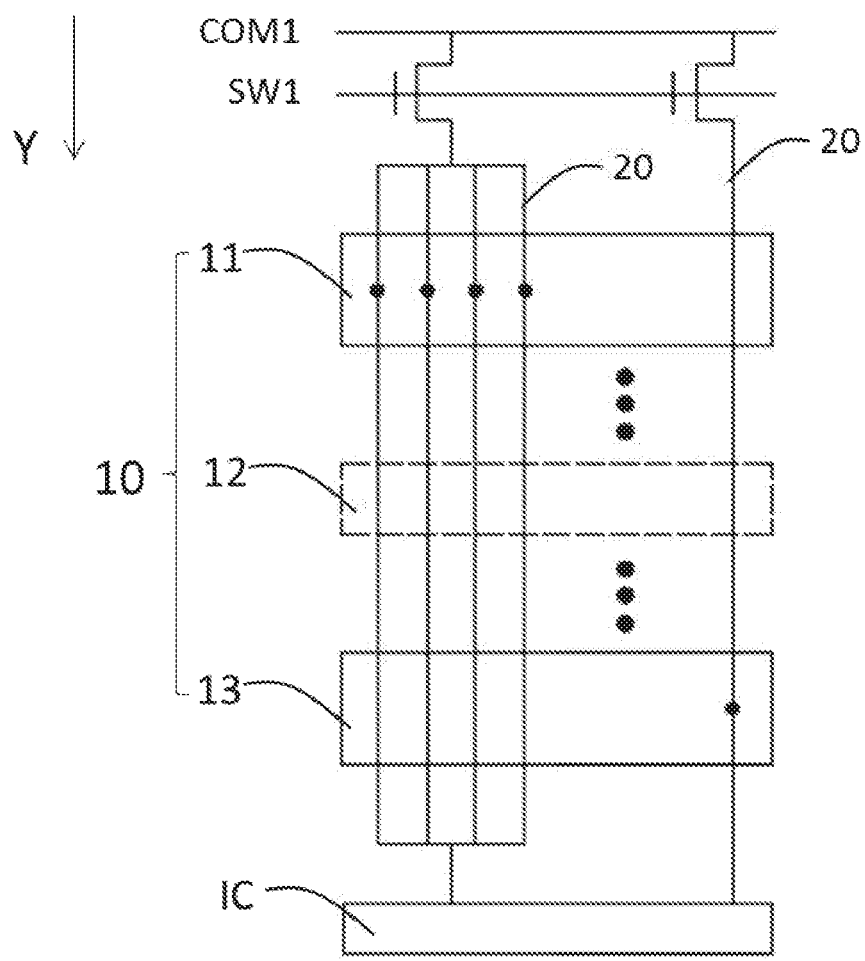
FIG. 4 is a schematic diagram of a second wiring manner of the touch traces electrically connected between the touch electrodes and the first common power line, and between the touch electrodes and the driving chip according to an embodiment of the present disclosure.
Figure 5A:
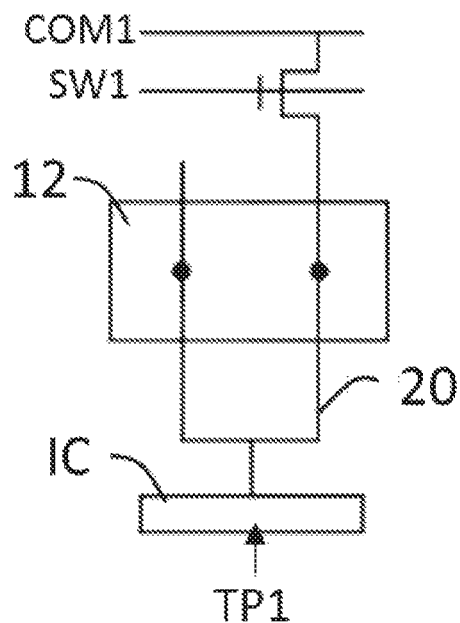
FIG. 5a is a schematic diagram of a first wiring manner of touch traces electrically connected between a second touch electrode and the first common power line, and between the second touch electrode and the driving chip.
Figure 5B:
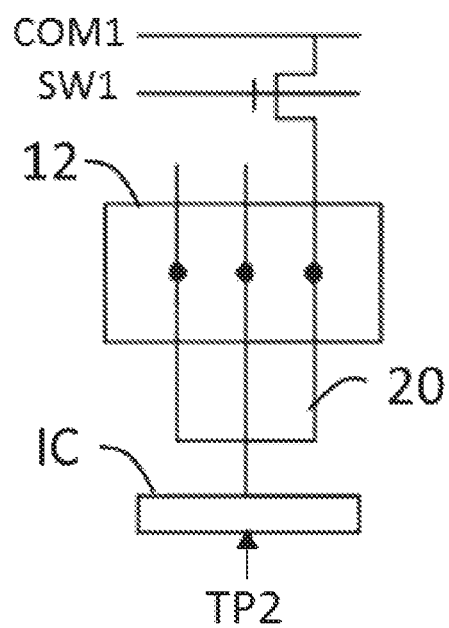
FIG. 5b is a schematic diagram of a second wiring manner of the touch traces electrically connected between the second touch electrode and the first common power line, and between the second touch electrode and the driving chip.
Figure 5C:
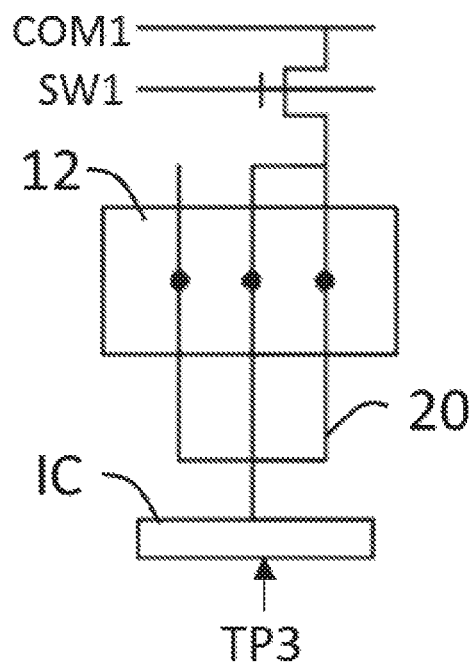
FIG. 5c is a schematic diagram of a third first wiring manner of the touch traces electrically connected between the second touch electrode and the first common power line, and between the second touch electrode and the driving chip.
Figure 5D:
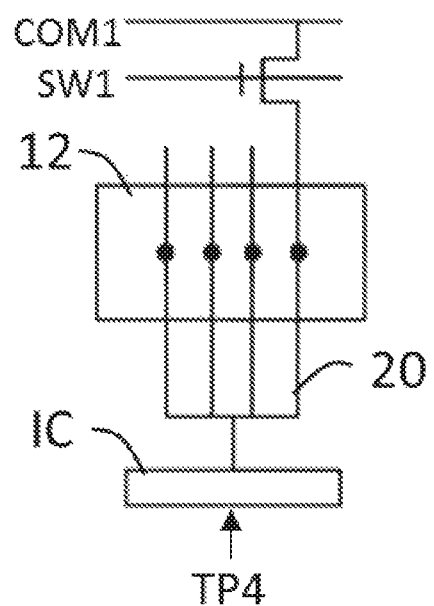
FIG. 5d is a schematic diagram of a fourth wiring manner of the touch traces electrically connected between the second touch electrode and the first common power line, and between the second touch electrode and the driving chip.
Figure 5E:
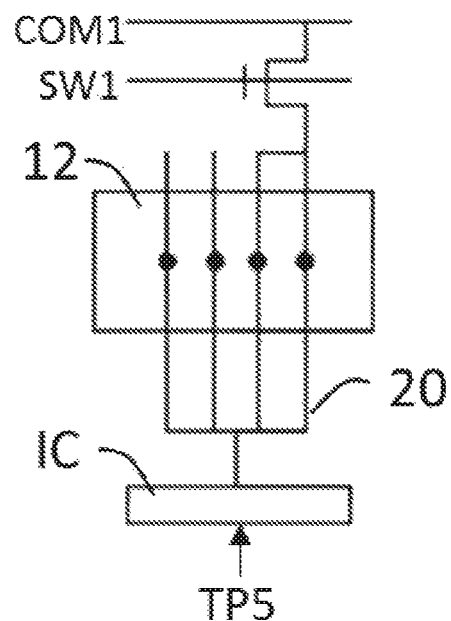
FIG. 5e is a schematic diagram of a fifth wiring manner of the touch traces electrically connected between the second touch electrode and the first common power line, and between the second touch electrode and the driving chip.
Figure 5F:
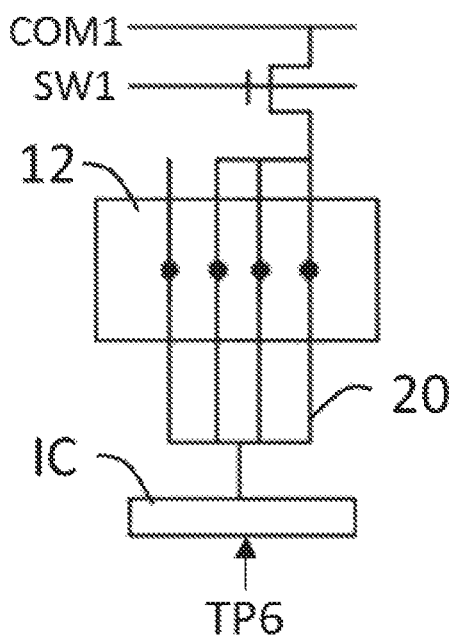
FIG. 5f is a schematic diagram of a sixth wiring manner of the touch traces electrically connected between the second touch electrode and the first common power line, and between the second touch electrode and the driving chip.

Please refer to FIG. 3, FIG. 4, and FIG. 5a to FIG. 5f. FIG. 3 is a schematic diagram of a first wiring manner of touch traces electrically connected between touch electrodes and a first common power line, and between the touch electrodes and a driving chip according to an embodiment of the present disclosure. FIG. 4 is a schematic diagram of a second wiring manner of the touch traces electrically connected between the touch electrodes and the first common power line, and between the touch electrodes and the driving chip according to an embodiment of the present disclosure. FIG. 5a to FIG. 5f are schematic diagrams of six alternative wiring manners of touch traces electrically connected between second touch electrode and the first common power line, and between the second touch electrode and the driving chip.

Optionally, the touch traces 20 are electrically connected to the first common power line COM1 and the touch electrodes 10 through a first switching transistor SW1. The first switching transistor SW1 is configured to control electrical conduction between the first common power line COM1 and the touch electrodes 10.

The touch electrodes 10 comprise a first touch electrode 11, a second touch electrode 12, and a third touch electrode 13 arranged along a first direction Y.

According to an embodiment of the present disclosure, as shown in FIG. 3 and FIG. 5a to FIG. 5f, a number of the touch traces 20 electrically connected between the second touch electrode 12 and the first common power line COM1 is greater than or equal to a number of the touch traces 20 electrically connected between the first touch electrode 11 and the first common power line COM1, and the number of the touch traces 20 electrically connected between the second touch electrode 12 and the first common power line COM1 is less than a number of the touch traces 20 electrically connected between the third touch electrode 13 and the first common power line COM1. It should be noted that numbers of the touch traces 20 electrically connected between the touch electrodes 10 and the first common power line COM1 directly affects voltages of the touch electrodes 10. In actual production, after taking into account factors such as channels of a driving chip and resolution of a display panel, numbers of touch traces connected to different touch electrodes will be different. In this embodiment, the numbers of the touch traces 20 electrically connected between the touch electrodes 10 and the first common power line COM1 are rationally configured into the aforementioned manner to realize a stepwise change in numbers of touch traces 20 connected to the first touch electrode 11, the second touch electrode 12, and the third touch electrode 13. This avoids sudden changes in numbers of touch traces connected to different touch electrodes. The sudden changes will seriously damage uniformity of voltage distributions of the touch electrodes and a common electrode. This embodiment is beneficial as it makes the voltage distributions of the touch electrodes and the common electrode in a thin film transistor array substrate become more consistent.

Furthermore, a number of the touch traces 20 electrically connected between the second touch electrode 12 and the driving chip IC is greater than a number of the touch traces 20 electrically connected between the first touch electrode 11 and the driving chip IC, and the number of the touch traces 20 electrically connected between the second touch electrode 12 and the driving chip IC is less than or equal to a number of the touch traces 20 electrically connected between the third touch electrode 13 and the driving chip IC. It should be noted that the driving chip IC transmits a voltage signal to the touch electrodes 10 through the touch traces 20 and performs signal acquisition and analysis. The driving chip IC and the first common power line COM1 jointly affect the voltages of the touch electrodes 10. In this embodiment, numbers of touch traces electrically connected between touch electrodes and a driving chip IC are rationally configured into the aforementioned manner to avoid sudden changes in the numbers of the touch traces connected to the different touch electrodes. This makes voltage distributions of the touch electrodes and a common electrode in a thin film transistor array substrate become more consistent.

It should be noted that, regarding a wiring manner of the touch traces 20 electrically connected between the second touch electrode 12 and the first common power line COM1, and between the second touch electrode 12 and the driving chip IC, this embodiment provides six implementations shown in FIG. 5a to FIG. 5f. In application, one or more of the six implementations can be selected and applied flexibly. In the first wiring manner TP1 shown in FIG. 5a, the number of the touch traces 20 electrically connected between the second touch electrode 12 and the first common power line COM1 is 1, and the number of the touch traces 20 electrically connected between the second touch electrode 12 and the driving chip IC is 2. In the second wiring manner TP2 shown in FIG. 5b, the number of the touch traces 20 electrically connected between the second touch electrode 12 and the first common power line COM1 is 1, and the number of the touch traces 20 electrically connected between the second touch electrode 12 and the driving chip IC is 3. In the third wiring manner TP3 shown in FIG. 5c, the number of the touch traces 20 electrically connected between the second touch electrode 12 and the first common power line COM1 is 2, and the number of the touch traces 20 electrically connected between the second touch electrode 12 and the driving chip IC is 3. In the fourth wiring manner TP4 shown in FIG. 5d, the number of the touch traces 20 electrically connected between the second touch electrode 12 and the first common power line COM1 is 1, and the number of the touch traces 20 electrically connected between the second touch electrode 12 and the driving chip IC is 4. In the fifth wiring manner TP5 shown in FIG. 5e, the number of the touch traces 20 electrically connected between the second touch electrode 12 and the first common power line COM1 is 2, and the number of the touch traces 20 electrically connected between the second touch electrode 12 and the driving chip IC is 4. In the sixth wiring manner TP6 shown in FIG. 5f, the number of the touch traces 20 electrically connected between the second touch electrode 12 and the first common power line COM1 is 3, and the number of the touch traces 20 electrically connected between the second touch electrode 12 and the driving chip IC is 4. In addition, it should be noted that the wiring manner of the touch traces 20 electrically connected between the second touch electrode 12 and the first common power line COM1, and between the second touch electrode 12 and the driving chip IC is not limited to the aforementioned six implementations, and can be adaptively expanded based on the same technical concept in practical applications.

Optionally, the first touch electrode 11 and the second touch electrode 12 are arranged adjacent to each other along the first direction Y. The number of the touch traces 20 electrically connected between the second touch electrode 12 and the first common power line COM1 is equal to the number of the touch traces 20 electrically connected between the first touch electrode 11 and the first common power line COM1. The number of the touch traces 20 electrically connected between the second touch electrode 12 and the driving chip IC is greater than the number of the touch traces 20 electrically connected between the first touch electrode 11 and the driving chip IC. The aforementioned arrangement can realize a stepwise change in the numbers of the touch traces 20 connected to the first touch electrode 11 and the second touch electrode 12 adjacent to each other, which helps voltage distributions of the first touch electrode 11 and the second touch electrode 12 become more consistent, thereby effectively avoiding large sudden changes in voltage.

Optionally, the second touch electrode 12 and the third touch electrode 13 are arranged adjacent to each other along the first direction Y. The number of the touch traces 20 electrically connected between the second touch electrode 12 and the first common power line COM1 is less than the number of the touch traces 20 electrically connected between the third touch electrode 13 and the first common power line COM1. The number of the touch traces 20 electrically connected between the second touch electrode 12 and the driving chip IC is equal to the number of the touch traces 20 electrically connected between the third touch electrode 13 and the driving chip IC. The aforementioned arrangement can realize a stepwise change in the numbers of the touch traces 20 connected to the second touch electrode 12 and the third touch electrode 13 adjacent to each other, which helps voltage distributions of the second touch electrode 12 and the third touch electrode 13 become more consistent, thereby effectively avoiding large sudden changes in voltage.

Optionally, the first touch electrode 11, the second touch electrode 12, and the third touch electrode 13 are sequentially arranged adjacent to each other along the first direction Y. The number of the touch traces 20 electrically connected between the second touch electrode 12 and the first common power line COM1 is equal to the number of the touch traces 20 electrically connected between the first touch electrode 11 and the first common power line COM1, and the number of the touch traces 20 electrically connected between the second touch electrode 12 and the driving chip IC is greater than the number of the touch traces 20 electrically connected between the first touch electrode 11 and the driving chip IC. Further, the number of the touch traces 20 electrically connected between the second touch electrode 12 and the first common power line COM1 is less than the number of the touch traces 20 electrically connected between the third touch electrode 13 and the first common power line COM1, and the number of the touch traces 20 electrically connected between the second touch electrode 12 and the driving chip IC is equal to the number of the touch traces 20 electrically connected between the third touch electrode 13 and the driving chip IC. The aforementioned arrangement can realize a stepwise change in the numbers of the touch traces 20 connected to the first touch electrode 11, the second touch electrode 12, and the third touch electrode 13 adjacent to each other, which helps voltage distributions of the first touch electrode 11, the second touch electrode 12, and the third touch electrode 13 become more consistent, thereby effectively avoiding large sudden changes in voltage.

Furthermore, optionally, the number of the touch traces 20 electrically connected between the second touch electrode 12 and the first common power line COM1 is 1, and the number of the touch traces 20 electrically connected between the second touch electrode 12 and the driving chip IC is 2. The number of the touch traces 20 electrically connected between the first touch electrode 11 and the first common power line COM1 and the number of the touch traces 20 electrically connected between the first touch electrode 11 and the driving chip IC are both 1. The number of the touch traces 20 electrically connected between the third touch electrode 13 and the first common power line COM1 and the number of the touch traces 20 electrically connected between the third touch electrode 13 and the driving chip IC are both 2. It should be understood that the above wiring arrangement of the touch traces 20 of this embodiment realizes that the numbers of the touch traces 20 connected to the first touch electrode 11, the second touch electrode 12, and the third touch electrode 13 are sequentially increased, so that the voltages of the first touch electrode 11, the second touch electrode 12, and the third touch electrode 13 are gradually increased. This effectively prevents large sudden changes in voltage and helps voltage distributions stay consistent.

Furthermore, optionally, the number of the touch traces 20 electrically connected between the second touch electrode 12 and the first common power line COM1 is 2, and the number of the touch traces 20 electrically connected between the second touch electrode 12 and the driving chip IC is 4. The number of the touch traces 20 electrically connected between the first touch electrode 11 and the first common power line COM1 and the number of the touch traces 20 electrically connected between the first touch electrode 11 and the driving chip IC are both 2. The number of the touch traces 20 electrically connected between the third touch electrode 13 and the first common power line COM1 and the number of the touch traces 20 electrically connected between the third touch electrode 13 and the driving chip IC are both 4. It should be understood that the above wiring arrangement of the touch traces 20 of this embodiment realizes that the numbers of the touch traces 20 connected to the first touch electrode 11, the second touch electrode 12, and the third touch electrode 13 are sequentially increased, so that the voltages of the first touch electrode 11, the second touch electrode 12, and the third touch electrode 13 are gradually increased. This effectively prevents large sudden changes in voltage and helps voltage distributions stay consistent.

According to an embodiment of the present disclosure, as shown in FIG. 4 and FIG. 5a to FIG. 5f, the number of the touch traces 20 electrically connected between the second touch electrode 12 and the first common power line COM1 is less than the number of the touch traces 20 electrically connected between the first touch electrode 11 and the first common power line COM1, and the number of the touch traces 20 electrically connected between the second touch electrode 12 and the first common power line COM1 is greater than or equal to the number of the touch traces 20 electrically connected between the third touch electrode 13 and the first common power line COM1. It should be noted that numbers of the touch traces 20 electrically connected between the touch electrodes 10 and the first common power line COM1 directly affects voltages of the touch electrodes 10. In actual production, considering factors of channels of a driving chip and resolution of a display panel, numbers of touch traces connected to different touch electrodes will be different. In this embodiment, numbers of touch traces electrically connected between touch electrodes and a first common power line are rationally configured into the aforementioned manner to avoid sudden changes in numbers of touch traces connected to different touch electrodes. The sudden changes will seriously damage uniformity of voltage distributions of the touch electrodes and a common electrode. This embodiment is beneficial as it makes the voltage distributions of the touch electrodes and the common electrode become more consistent in a thin film transistor array substrate.

Furthermore, the number of the touch traces 20 electrically connected between the second touch electrode 12 and the driving chip IC is less than or equal to the number of the touch traces 20 electrically connected between the first touch electrode 11 and the driving chip IC, and the number of the touch traces 20 electrically connected between the second touch electrode 12 and the driving chip IC is greater than the number of the touch traces 20 electrically connected between the third touch electrode 13 and the driving chip IC. It should be noted that the driving chip IC transmits a voltage signal to the touch electrodes 10 through the touch traces 20 and performs signal acquisition and analysis. The driving chip IC and the first common power line COM1 jointly affect the voltages of the touch electrodes 10. In this embodiment, numbers of touch traces electrically connected between touch electrodes and a driving chip IC are rationally configured into the aforementioned manner to avoid sudden changes in the numbers of the touch traces connected to the different touch electrodes. This makes voltage distribution of the touch electrodes and a common electrode in a thin film transistor array substrate become more consistent.

It should be noted that, regarding a wiring manner of the touch traces 20 electrically connected between the second touch electrode 12 and the first common power line COM1, and between the second touch electrode 12 and the driving chip IC, this embodiment provides six implementations shown in FIG. 5a to FIG. 5f. In application, one or more of the six implementations can be selected and applied flexibly. The wiring manners of the touch traces 20 electrically connected between the second touch electrode 12 and the first common power line COM1, and between the second touch electrode 12 and the driving chip IC as shown in FIG. 5a to FIG. 5f have been described in the above embodiments and will not be described in detail herein. It should be noted that in this embodiment, the wiring manner of the touch traces 20 electrically connected between the second touch electrode 12 and the first common power line COM1, and between the second touch electrode 12 and the driving chip IC is not limited to the aforementioned six implementations, and can be adaptively expanded based on the same technical concept in practical applications.

Optionally, the first touch electrode 11 and the second touch electrode 12 are arranged adjacent to each other along the first direction Y. The number of the touch traces 20 electrically connected between the second touch electrode 12 and the first common power line COM1 is less than the number of the touch traces 20 electrically connected between the first touch electrode 11 and the first common power line COM1. The number of the touch traces 20 electrically connected between the second touch electrode 12 and the driving chip IC is equal to the number of the touch traces 20 electrically connected between the first touch electrode 11 and the driving chip IC. The aforementioned arrangement can realize a stepwise change in the numbers of the touch traces 20 connected to the first touch electrode 11 and the second touch electrode 12 adjacent to each other, This embodiment is beneficial as it makes the voltage distributions of the touch electrodes and the common electrode in a thin film transistor array substrate become more consistent.

Optionally, the second touch electrode 12 and the third touch electrode 13 are arranged adjacent to each other along the first direction Y. The number of the touch traces 20 electrically connected between the second touch electrode 12 and the first common power line COM1 is equal to the number of the touch traces 20 electrically connected between the third touch electrode 13 and the first common power line COM1. The number of the touch traces 20 electrically connected between the second touch electrode 12 and the driving chip IC is greater than the number of the touch traces 20 electrically connected between the third touch electrode 13 and the driving chip IC. The aforementioned arrangement can realize a stepwise change in the numbers of the touch traces 20 connected to the second touch electrode 12 and the third touch electrode 13 adjacent to each other, which helps voltage distributions of the second touch electrode 12 and the third touch electrode 13 become more consistent, thereby effectively avoiding large sudden changes in voltage.

Optionally, the first touch electrode 11, the second touch electrode 12, and the third touch electrode 13 are sequentially arranged adjacent to each other along the first direction Y. The number of the touch traces 20 electrically connected between the second touch electrode 12 and the first common power line COM1 is less than the number of the touch traces 20 electrically connected between the first touch electrode 11 and the first common power line COM1, and the number of the touch traces 20 electrically connected between the second touch electrode 12 and the driving chip IC is equal to the number of the touch traces 20 electrically connected between the first touch electrode 11 and the driving chip IC. Further, the number of the touch traces 20 electrically connected between the second touch electrode 12 and the first common power line COM1 is equal to the number of the touch traces 20 electrically connected between the third touch electrode 13 and the first common power line COM1, and the number of the touch traces 20 electrically connected between the second touch electrode 12 and the driving chip IC is greater than the number of the touch traces 20 electrically connected between the third touch electrode 13 and the driving chip IC. The aforementioned arrangement can realize a stepwise change in the numbers of the touch traces 20 connected to the first touch electrode 11, the second touch electrode 12, and the third touch electrode 13 adjacent to each other, which helps voltage distributions of the first touch electrode 11, the second touch electrode 12, and the third touch electrode 13 become more consistent, thereby effectively avoiding large sudden changes in voltage.

Furthermore, optionally, the number of the touch traces 20 electrically connected between the second touch electrode 12 and the first common power line COM1 is 1, and the number of the touch traces 20 electrically connected between the second touch electrode 12 and the driving chip IC is 2. The number of the touch traces 20 electrically connected between the first touch electrode 11 and the first common power line COM1 and the number of the touch traces 20 electrically connected between the first touch electrode 11 and the driving chip IC are both 2. The number of the touch traces 20 electrically connected between the third touch electrode 13 and the first common power line COM1 and the number of the touch traces 20 electrically connected between the third touch electrode 13 and the driving chip IC are both 1. It should be understood that the above wiring arrangement of the touch traces 20 of this embodiment realizes that the numbers of the touch traces 20 connected to the first touch electrode 11, the second touch electrode 12, and the third touch electrode 13 are sequentially decreased, so that the voltages of the first touch electrode 11, the second touch electrode 12, and the third touch electrode 13 are gradually decreased. This effectively prevents large sudden changes in voltage and helps voltage distributions stay consistent.

Figure 6:
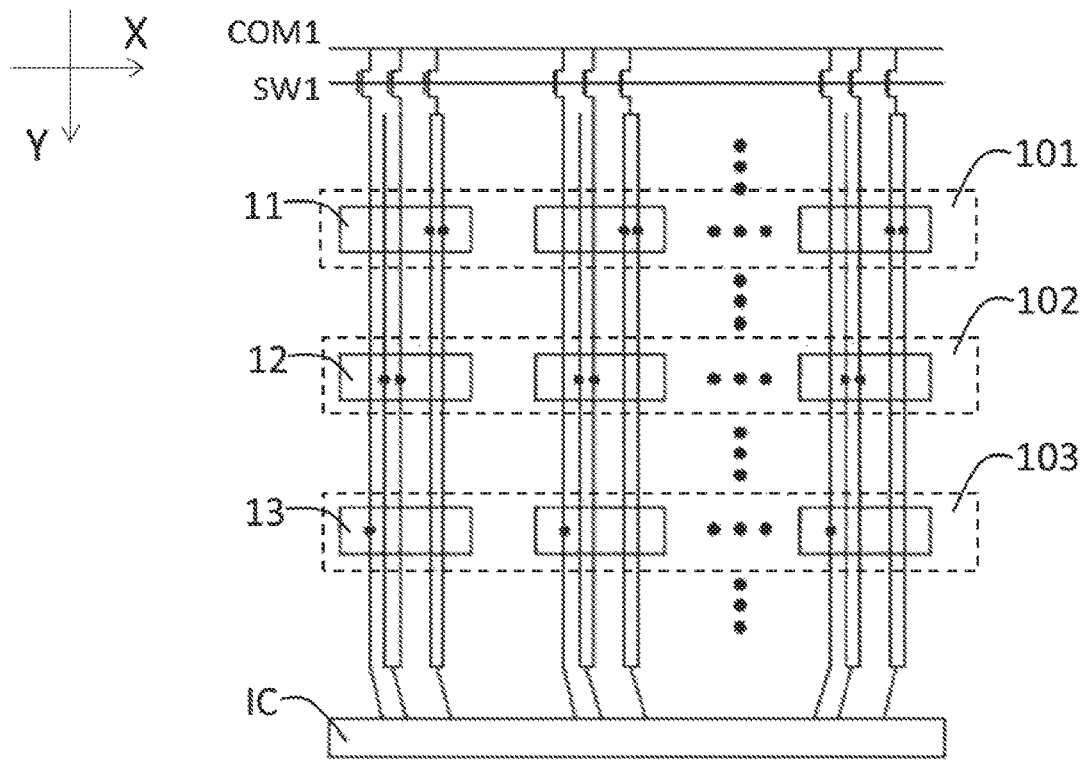
FIG. 6 is a schematic diagram of a third wiring manner of the touch traces electrically connected between the touch electrodes and the first common power line, and between the touch electrodes and the driving chip according to an embodiment of the present disclosure.

Furthermore, as shown in FIG. 4 and FIG. 6, it is defined that in a second direction X, the first touch electrode 11 and touch electrodes in a same column form a first matrix 101, the second touch electrode 12 and touch electrodes in the same column form a second matrix 102, and the third touch electrode 13 and touch electrodes in the same column form a third matrix 103. At least some of the touch electrodes in the first matrix 101 have the same wiring manner of touch traces as the first touch electrode 11. At least some of the touch electrodes in the second matrix 102 have the same wiring manner of touch traces as the second touch electrode 12. At least some of the touch electrodes in the third matrix 103 have the same wiring manner of touch traces as the third touch electrode 13. For the wiring manner of the touch traces connected to the touch electrodes of each of the matrixes, reference may be made to the above embodiment, and will not be described in detail herein.

Furthermore, optionally, the number of the touch traces 20 electrically connected between the second touch electrode 12 and the first common power line COM1 is 2, and the number of the touch traces 20 electrically connected between the second touch electrode 12 and the driving chip IC is 4. The number of the touch traces 20 electrically connected between the first touch electrode 11 and the first common power line COM1 and the number of the touch traces 20 electrically connected between the first touch electrode 11 and the driving chip IC are both 4. The number of the touch traces 20 electrically connected between the third touch electrode 13 and the first common power line COM1 and the number of the touch traces 20 electrically connected between the third touch electrode 13 and the driving chip IC are both 2. It should be understood that the above wiring arrangement of the touch traces 20 of this embodiment realizes that the numbers of the touch traces 20 connected to the first touch electrode 11, the second touch electrode 12, and the third touch electrode 13 are sequentially decreased, so that the voltages of the first touch electrode 11, the second touch electrode 12, and the third touch electrode 13 are gradually decreased. This effectively prevents large sudden changes in voltage and helps voltage distributions stay consistent.

Figure 7:
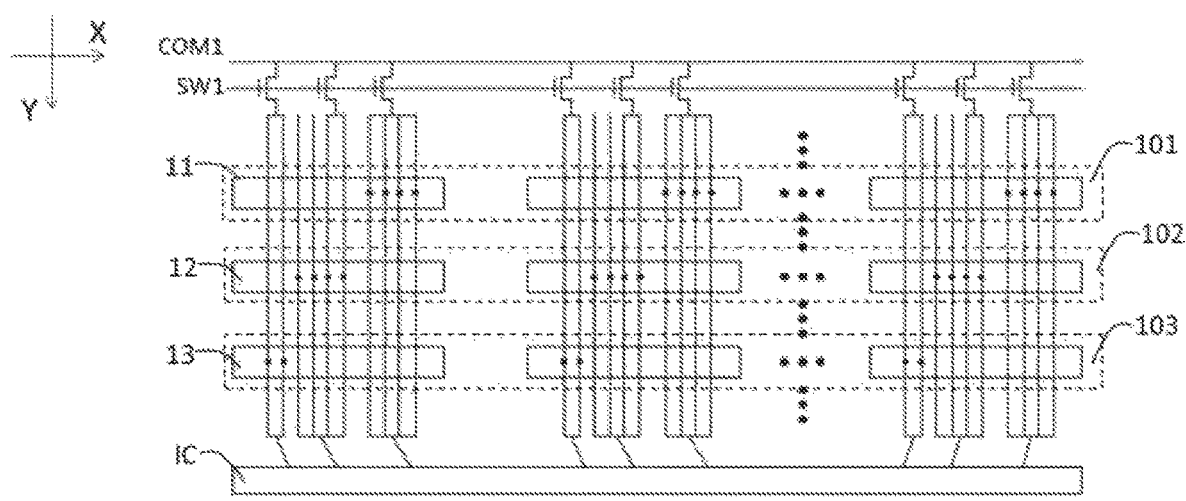
FIG. 7 is a schematic diagram of a fourth wiring manner of the touch traces electrically connected between the touch electrodes and the first common power line, and between the touch electrodes and the driving chip according to an embodiment of the present disclosure.

Furthermore, as shown in FIG. 4 and FIG. 7, it is defined that in a second direction X, the first touch electrode 11 and touch electrodes in a same column form a first matrix 101, the second touch electrode 12 and touch electrodes in a same column form a second matrix 102, and the third touch electrode 13 and touch electrodes in a same column form a third matrix 103. At least some of the touch electrodes in the first matrix 101 have the same wiring manner of touch traces as the first touch electrode 11. At least some of the touch electrodes in the second matrix 102 have the same wiring manner of touch traces as the second touch electrode 12. At least some of the touch electrodes in the third matrix 103 have the same wiring manner of touch traces as the third touch electrode 13. For the wiring manner of the touch traces connected to the touch electrodes of each of the matrixes, reference may be made to the above embodiment, and will not be described in detail herein.

Figure 8:
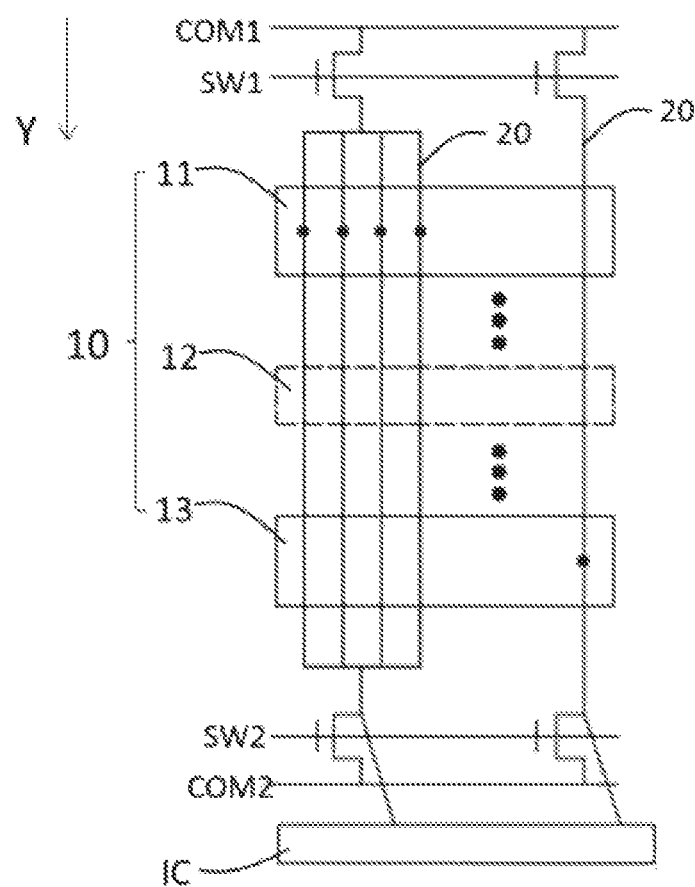
FIG. 8 is a schematic diagram of a wiring manner of touch traces electrically connected to the touch electrodes, the first common power line, a second common power line, and the driving chip according to an embodiment of the present disclosure.

Optionally, as shown in FIG. 2 and FIG. 8, the first common power line COM1 and the driving chip IC are disposed in the non-display area NA, and are respectively disposed at opposite sides of the touch function layer 03 along the first direction Y. Furthermore, a second common power line COM2 is disposed on the same side as the driving chip IC. The second common power line COM2 is electrically connected to the touch electrodes 10 by the touch traces 20. The second common power line COM2 and the driving chip IC are connected to the same touch traces 20. Optionally, the touch traces 20 are electrically connected to the second common power line COM2 and the touch electrodes 10 through a second switching transistor SW2. The second switching transistor SW2 is configured to control electrical conduction between the second common power line COM2 and the touch electrodes 10. It should be noted that the first common power line COM1 and the second common power line COM2 provide voltages to the touch electrodes 10 from both ends of the touch function layer 03, which can promote voltage equalization of the different touch electrodes 10.

In the above, the present disclosure provides a thin film transistor array substrate comprising a plurality of touch electrodes. Each of the touch electrodes is electrically connected to a first common power line and a driving chip through one or more touch traces. In the present disclosure, numbers of touch traces electrically connected between touch electrodes and a first common power line and between the touch electrodes and a driving chip are rationally configured to eliminate or reduce a sudden change in voltage due to a difference in the numbers of the touch traces connected different touch electrodes to the first common power line and the driving chip. This makes voltage distributions of the touch electrodes and the common electrode in the thin film transistor array substrate tend to be consistent, thereby improving image quality.

It should be noted that the present application has been described in the above specific embodiments, but the above embodiments are not intended to limit the present application. Those skilled in the art may make various changes and modifications without departing from the scope of the present application. The scope of the present application is determined by claims.

What is claimed is:

1. A thin film transistor array substrate, comprising:
a base substrate having a non-display area;
a thin film transistor array layer disposed on the base substrate; and
a touch function layer disposed in the thin film transistor array layer and comprising a plurality of touch electrodes, wherein each of the touch electrodes is electrically connected to a first common power line and a driving chip through one or more touch traces, and the touch electrodes comprise a first touch electrode, a second touch electrode, and a third touch electrode arranged along a first direction;
wherein the first common power line and the driving chip are disposed in the non-display area and are respectively disposed at opposite sides of the touch function layer along the first direction, and a second common power line is disposed on a same side as the driving chip and is electrically connected to the touch electrodes by the touch traces; and
wherein a number of the touch traces electrically connected between the second touch electrode and the first common power line is greater than or equal to a number of the touch traces electrically connected between the first touch electrode and the first common power line, and the number of the touch traces electrically connected between the second touch electrode and the first common power line is less than a number of the touch traces electrically connected between the third touch electrode and the first common power line; or
the number of the touch traces electrically connected between the second touch electrode and the first common power line is less than the number of the touch traces electrically connected between the first touch electrode and the first common power line, and the number of the touch traces electrically connected between the second touch electrode and the first common power line is greater than or equal to the number of the touch traces electrically connected between the third touch electrode and the first common power line.

2. The thin film transistor array substrate according to claim 1, wherein:
a number of the touch traces electrically connected between the second touch electrode and the driving chip is greater than a number of the touch traces electrically connected between the first touch electrode and the driving chip, and the number of the touch traces electrically connected between the second touch electrode and the driving chip is less than or equal to a number of the touch traces electrically connected between the third touch electrode and the driving chip; or
the number of the touch traces electrically connected between the second touch electrode and the driving chip is less than or equal to the number of the touch traces electrically connected between the first touch electrode and the driving chip, and the number of the touch traces electrically connected between the second touch electrode and the driving chip is greater than the number of the touch traces electrically connected between the third touch electrode and the driving chip.

3. The thin film transistor array substrate according to claim 2, wherein:
the number of the touch traces electrically connected between the second touch electrode and the first common power line is greater than or equal to the number of the touch traces electrically connected between the first touch electrode and the first common power line;
the number of the touch traces electrically connected between the second touch electrode and the first common power line is less than the number of the touch traces electrically connected between the third touch electrode and the first common power line;
the number of the touch traces electrically connected between the second touch electrode and the driving chip is less than or equal to the number of the touch traces electrically connected between the third touch electrode and the driving chip; and
the number of the touch traces electrically connected between the second touch electrode and the driving chip is greater than the number of the touch traces electrically connected between the first touch electrode and the driving chip.

4. The thin film transistor array substrate according to claim 3, wherein:
the first touch electrode and the second touch electrode are arranged adjacent to each other along the first direction;
the number of the touch traces electrically connected between the second touch electrode and the first common power line is equal to the number of the touch traces electrically connected between the first touch electrode and the first common power line; and
the number of the touch traces electrically connected between the second touch electrode and the driving chip is greater than the number of the touch traces electrically connected between the first touch electrode and the driving chip.

5. The thin film transistor array substrate according to claim 3, wherein:
the second touch electrode and the third touch electrode are arranged adjacent to each other along the first direction;
the number of the touch traces electrically connected between the second touch electrode and the first common power line is less than the number of the touch traces electrically connected between the third touch electrode and the first common power line; and
the number of the touch traces electrically connected between the second touch electrode and the driving chip is equal to the number of the touch traces electrically connected between the third touch electrode and the driving chip.

6. The thin film transistor array substrate according to claim 3, wherein:
the first touch electrode, the second touch electrode, and the third touch electrode are sequentially arranged adjacent to each other along the first direction;
the number of the touch traces electrically connected between the second touch electrode and the first common power line is equal to the number of the touch traces electrically connected between the first touch electrode and the first common power line;
the number of the touch traces electrically connected between the second touch electrode and the driving chip is greater than the number of the touch traces electrically connected between the first touch electrode and the driving chip;
the number of the touch traces electrically connected between the second touch electrode and the first common power line is less than the number of the touch traces electrically connected between the third touch electrode and the first common power line; and the number of the touch traces electrically connected between the second touch electrode and the driving chip is equal to the number of the touch traces electrically connected between the third touch electrode and the driving chip.

7. The thin film transistor array substrate according to claim 2, wherein:
the number of the touch traces electrically connected between the second touch electrode and the first common power line is greater than or equal to the number of the touch traces electrically connected between the third touch electrode and the first common power line;
the number of the touch traces electrically connected between the second touch electrode and the first common power line is less than the number of the touch traces electrically connected between the first touch electrode and the first common power line;
the number of the touch traces electrically connected between the second touch electrode and the driving chip is less than or equal to the number of the touch traces electrically connected between the first touch electrode and the driving chip; and
the number of the touch traces electrically connected between the second touch electrode and the driving chip is greater than the number of the touch traces electrically connected between the third touch electrode and the driving chip.

8. The thin film transistor array substrate according to claim 7, wherein:
the first touch electrode and the second touch electrode are arranged adjacent to each other along the first direction;
the number of the touch traces electrically connected between the second touch electrode and the first common power line is less than the number of the touch traces electrically connected between the first touch electrode and the first common power line; and
the number of the touch traces electrically connected between the second touch electrode and the driving chip is equal to the number of the touch traces electrically connected between the first touch electrode and the driving chip.

9. The thin film transistor array substrate according to claim 7, wherein:
the second touch electrode and the third touch electrode are arranged adjacent to each other along the first direction;
the number of the touch traces electrically connected between the second touch electrode and the first common power line is equal to the number of the touch traces electrically connected between the third touch electrode and the first common power line; and
the number of the touch traces electrically connected between the second touch electrode and the driving chip is greater than the number of the touch traces electrically connected between the third touch electrode and the driving chip.

10. The thin film transistor array substrate according to claim 7, wherein:
the first touch electrode, the second touch electrode, and the third touch electrode are sequentially arranged adjacent to each other along the first direction;
the number of the touch traces electrically connected between the second touch electrode and the first common power line is less than the number of the touch traces electrically connected between the first touch electrode and the first common power line;
the number of the touch traces electrically connected between the second touch electrode and the driving chip is equal to the number of the touch traces electrically connected between the first touch electrode and the driving chip;
the number of the touch traces electrically connected between the second touch electrode and the first common power line is equal to the number of the touch traces electrically connected between the third touch electrode and the first common power line; and
the number of the touch traces electrically connected between the second touch electrode and the driving chip is greater than the number of the touch traces electrically connected between the third touch electrode and the driving chip.

11. The thin film transistor array substrate according to claim 1, wherein:
the thin film transistor array layer comprises:
an active layer disposed on the base substrate;
a gate insulating layer disposed on the active layer;
a gate electrode disposed on the gate insulating layer;
an interlayer insulating layer disposed on the gate electrode; and
a source/drain electrode disposed on the interlayer insulating layer;
the thin film transistor array substrate further comprises:
a first insulating layer disposed on the source/drain electrode;
a common electrode disposed on the first insulating layer;
a second insulating layer disposed on the common electrode; and
a pixel electrode is disposed on the second insulating layer;
the common electrode is electrically connected to the touch electrodes through via holes in the first insulating layer; and
the pixel electrode is electrically connected to the source/drain electrode through a via hole penetrating the first insulating layer and the second insulating layer.

12. The thin film transistor array substrate according to claim 1, wherein a first switching transistor is disposed on the touch traces connected between the touch electrodes and the first common power line, and a second switching transistor is disposed on the touch traces connected between the touch electrodes and the second common power line.

13. A touch display panel, comprising a thin film transistor array substrate, wherein:
the thin film transistor array substrate comprises:
a base substrate having a non-display area;
a thin film transistor array layer disposed on the base substrate; and
a touch function layer disposed in the thin film transistor array layer and comprising a plurality of touch electrodes, wherein each of the touch electrodes is electrically connected to a first common power line and a driving chip through one or more touch traces, and the touch electrodes comprise a first touch electrode, a second touch electrode, and a third touch electrode arranged along a first direction;
wherein the first common power line and the driving chip are disposed in the non-display area and are respectively disposed at opposite sides of the touch function layer along the first direction, and a second common power line is disposed on a same side as the driving chip and is electrically connected to the touch electrodes by the touch traces; and wherein a number of the touch traces electrically connected between the second touch electrode and the first common power line is greater than or equal to a number of the touch traces electrically connected between the first touch electrode and the first common power line, and the number of the touch traces electrically connected between the second touch electrode and the first common power line is less than a number of the touch traces electrically connected between the third touch electrode and the first common power line; or the number of the touch traces electrically connected between the second touch electrode and the first common power line is less than the number of the touch traces electrically connected between the first touch electrode and the first common power line, and the number of the touch traces electrically connected between the second touch electrode and the first common power line is greater than or equal to the number of the touch traces electrically connected between the third touch electrode and the first common power line.

14. The touch display panel according to claim 13, further comprising:
   a color filter substrate disposed opposite to the thin film transistor array substrate; and
   liquid crystals disposed between the thin film transistor array substrate and the color filter substrate.

15. The touch display panel according to claim 13, wherein:
   a number of the touch traces electrically connected between the second touch electrode and the driving chip is greater than a number of the touch traces electrically connected between the first touch electrode and the driving chip, and the number of the touch traces electrically connected between the second touch electrode and the driving chip is less than or equal to a number of the touch traces electrically connected between the third touch electrode and the driving chip; or
   the number of the touch traces electrically connected between the second touch electrode and the driving chip is less than or equal to the number of the touch traces electrically connected between the first touch electrode and the driving chip, and the number of the touch traces electrically connected between the second touch electrode and the driving chip is greater than the number of the touch traces electrically connected between the third touch electrode and the driving chip.

16. The touch display panel according to claim 15, wherein:
   the number of the touch traces electrically connected between the second touch electrode and the first common power line is greater than or equal to the number of the touch traces electrically connected between the first touch electrode and the first common power line;
   the number of the touch traces electrically connected between the second touch electrode and the first common power line is less than the number of the touch traces electrically connected between the third touch electrode and the first common power line;
   the number of the touch traces electrically connected between the second touch electrode and the driving chip is less than or equal to the number of the touch traces electrically connected between the third touch electrode and the driving chip; and
   the number of the touch traces electrically connected between the second touch electrode and the driving chip is greater than the number of the touch traces electrically connected between the first touch electrode and the driving chip.

17. The touch display panel according to claim 15, wherein:
   the number of the touch traces electrically connected between the second touch electrode and the first common power line is greater than or equal to the number of the touch traces electrically connected between the third touch electrode and the first common power line;
   the number of the touch traces electrically connected between the second touch electrode and the first common power line is less than the number of the touch traces electrically connected between the first touch electrode and the first common power line;
   the number of the touch traces electrically connected between the second touch electrode and the driving chip is less than or equal to the number of the touch traces electrically connected between the first touch electrode and the driving chip; and
   the number of the touch traces electrically connected between the second touch electrode and the driving chip is greater than the number of the touch traces electrically connected between the third touch electrode and the driving chip.

18. A touch display panel, comprising:
   a thin film transistor array substrate comprising:
      a base substrate having a non-display area;
      a thin film transistor array layer disposed on the base substrate; and
      a touch function layer disposed in the thin film transistor array layer and comprising a plurality of touch electrodes, wherein each of the touch electrodes is electrically connected to a first common power line and a driving chip through one or more touch traces, and the touch electrodes comprise a first touch electrode, a second touch electrode, and a third touch electrode sequentially arranged adjacent to each other along a first direction;
   a color filter substrate disposed opposite to the thin film transistor array substrate; and
   liquid crystals disposed between the thin film transistor array substrate and the color filter substrate;
   wherein the first common power line and the driving chip are disposed in the non-display area and are respectively disposed at opposite sides of the touch function layer along the first direction, and a second common power line is disposed on a same side as the driving chip and is electrically connected to the touch electrodes by the touch traces; and
   wherein a number of the touch traces electrically connected between the second touch electrode and the first common power line is equal to a number of the touch traces electrically connected between the first touch electrode and the first common power line, a number of the touch traces electrically connected between the second touch electrode and the driving chip is greater than a number of the touch traces electrically connected between the first touch electrode and the driving chip, the number of the touch traces electrically connected between the second touch electrode and the first common power line is less than a number of the touch traces electrically connected between the third touch electrode and the first common power line, and the number of the touch traces electrically connected between the second touch electrode and the driving chip is equal to a number of the touch traces electrically connected between the third touch electrode and the driving chip; or the number of the touch traces electrically connected between the second touch electrode and the first common power line is less than the number of the touch traces electrically connected between the first touch electrode and the first common power line, the number of the touch traces electrically connected between the second touch electrode and the driving chip is equal to the number of the touch traces electrically connected between the first touch electrode and the driving chip, the number of the touch traces electrically connected between the second touch electrode and the first common power line is equal to the number of the touch traces electrically connected between the third touch electrode and the first common power line, and the number of the touch traces electrically connected between the second touch electrode and the driving chip is greater than the number of the touch traces electrically connected between the third touch electrode and the driving chip.

* * * * *